(12) United States Patent
Murata et al.

(10) Patent No.: US 7,804,133 B2
(45) Date of Patent: Sep. 28, 2010

(54) SEMICONDUCTOR STORAGE DEVICE AND MANUFACTURING METHOD THEREOF

(75) Inventors: Takeshi Murata, Kawasaki (JP);
Makoto Mizukami, Kawasaki (JP);
Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 214 days.

(21) Appl. No.: 12/022,382

(22) Filed: Jan. 30, 2008

(65) Prior Publication Data

US 2008/0179677 A1 Jul. 31, 2008

(30) Foreign Application Priority Data

Jan. 31, 2007 (JP) ............... 2007-021170

(51) Int. Cl.
*H01L 27/115* (2006.01)
(52) U.S. Cl. ............... 257/350; 257/391; 257/E27.102; 257/E27.112
(58) Field of Classification Search ................ 257/350, 257/391, 392, E27.102, E27.112
See application file for complete search history.

(56) References Cited

U.S. PATENT DOCUMENTS 6,642,105 B2 11/2003 Kim et al.
2006/0048702 A1 3/2006 Son et al.
2006/0170047 A1* 8/2006 Ishimaru ............... 257/347
2007/0102749 A1* 5/2007 Shirota et al. ............. 257/314
2007/0138536 A1* 6/2007 Arai et al. ................ 257/315

FOREIGN PATENT DOCUMENTS

JP  2003-203967  7/2003

OTHER PUBLICATIONS

U.S. Appl. No. 12/167,695, filed Jul. 3, 2008, Mizushima, et al.

* cited by examiner

*Primary Examiner*—Minh-Loan T Tran
*Assistant Examiner*—W. Wendy Kuo
(74) *Attorney, Agent, or Firm*—Oblon, Spivak, McClelland, Maier & Neustadt, L.L.P.

(57) ABSTRACT

Semiconductor storage devices in which a plurality of semiconductor element devices having different functions are disposed in the appropriate region of the partial SOI substrate and the interface between each gate insulator and each gate electrode is formed to be the same level, and manufacturing methods thereof are disclosed. According to one aspect, there is provided a semiconductor storage device includes a first semiconductor region provided in a semiconductor substrate including a buried insulator having opening portions, a second semiconductor region without including buried insulator, a plurality of first semiconductor element devices disposed above the buried insulator, a plurality of second semiconductor element devices each disposed in a region including a region above the opening portion of the buried insulator, and a plurality of third semiconductor element devices disposed in the second semiconductor region.

13 Claims, 11 Drawing Sheets

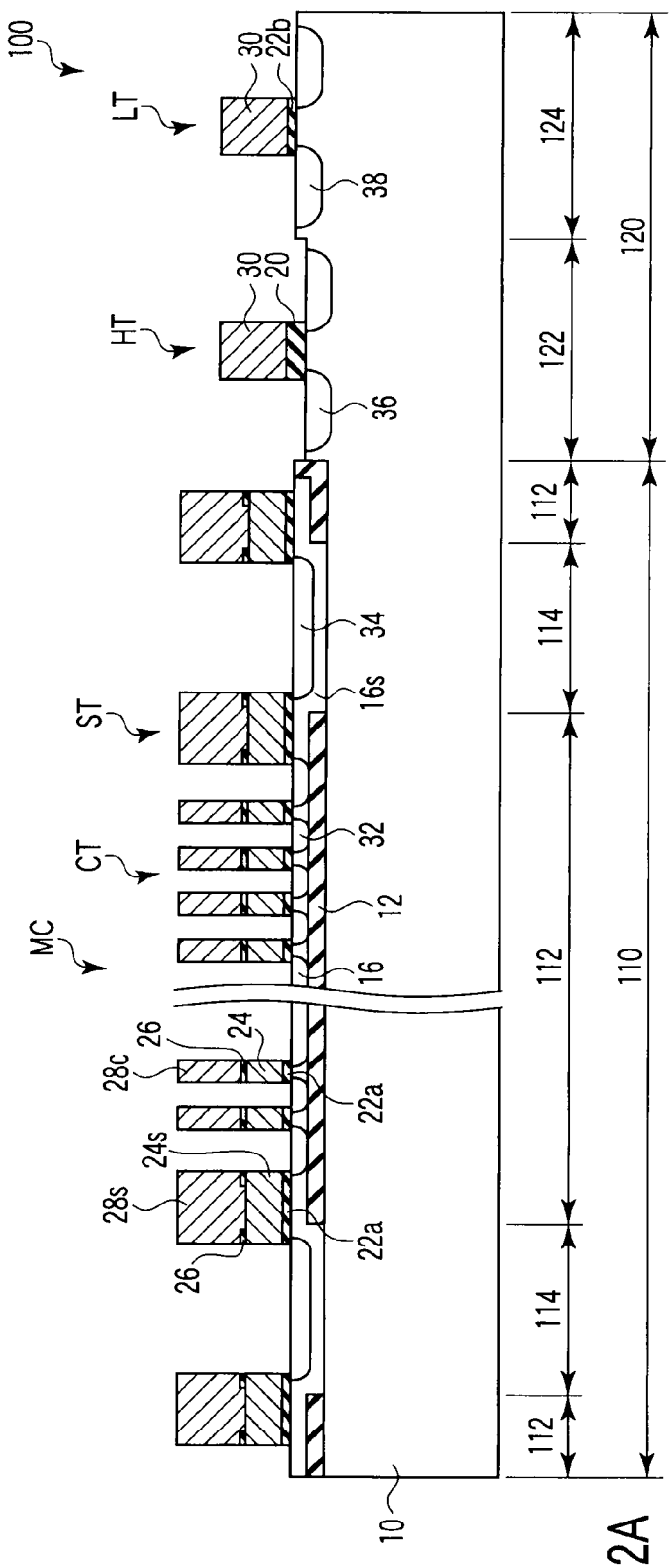
FIG. 2A
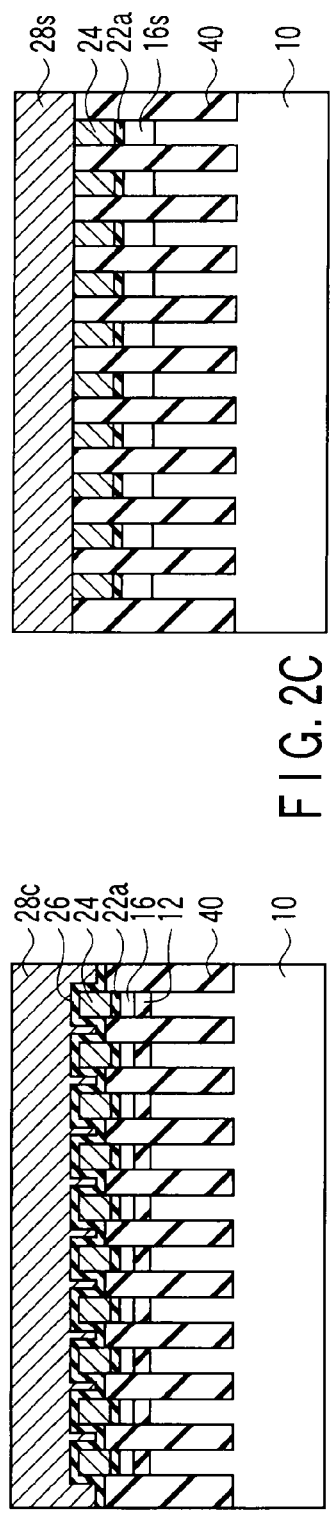
FIG. 2B
FIG. 2C

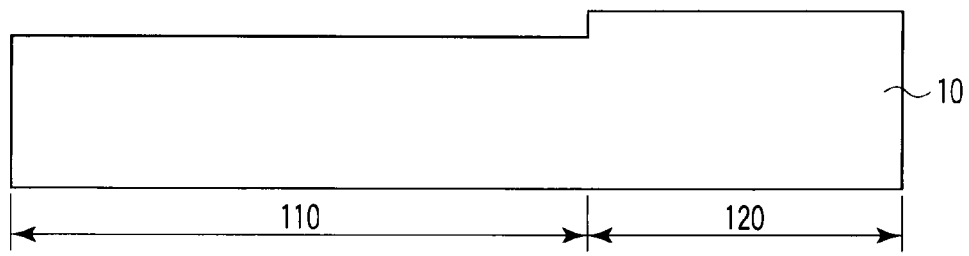
F I G. 3A
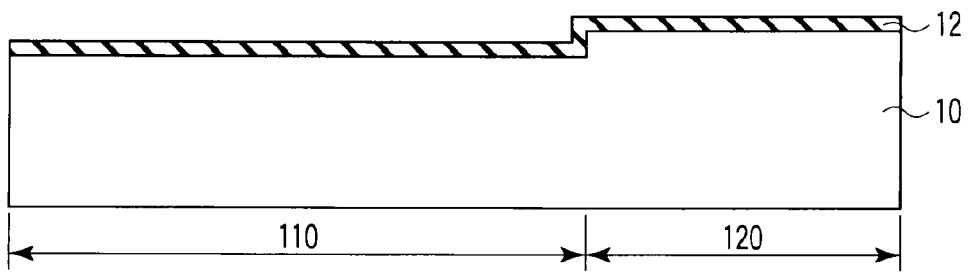
F I G. 3B
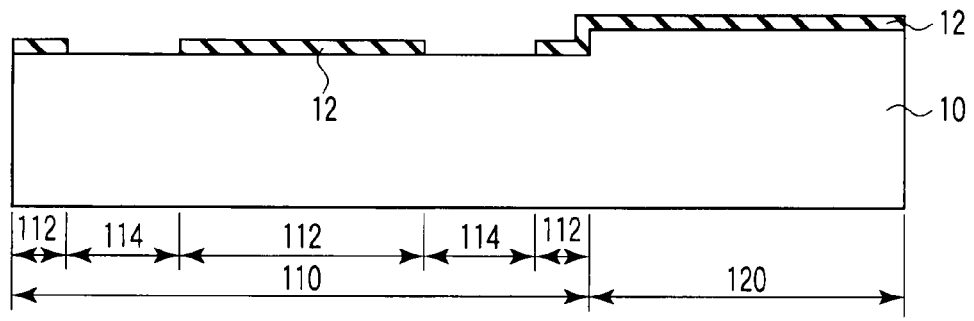
F I G. 3C
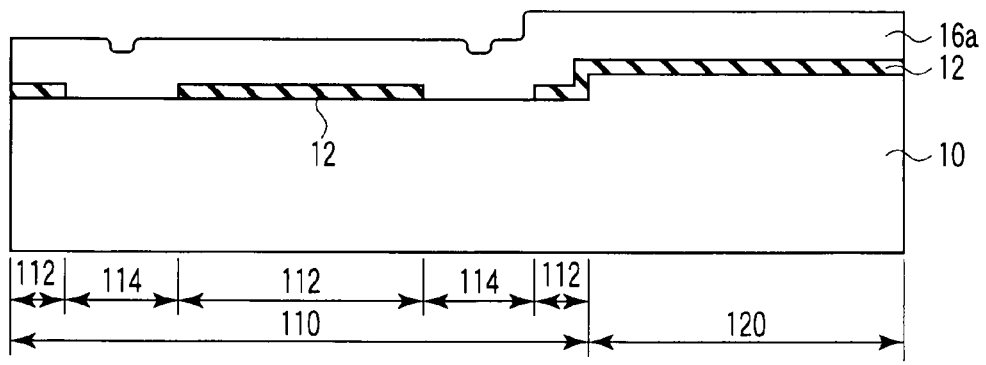
F I G. 3D

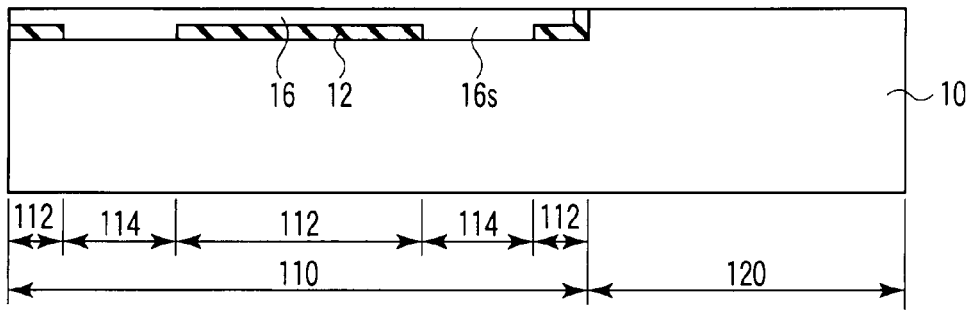
F I G. 3E
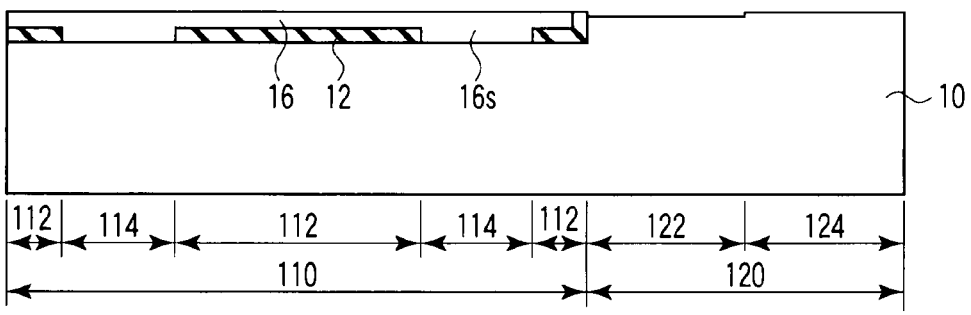
F I G. 3F
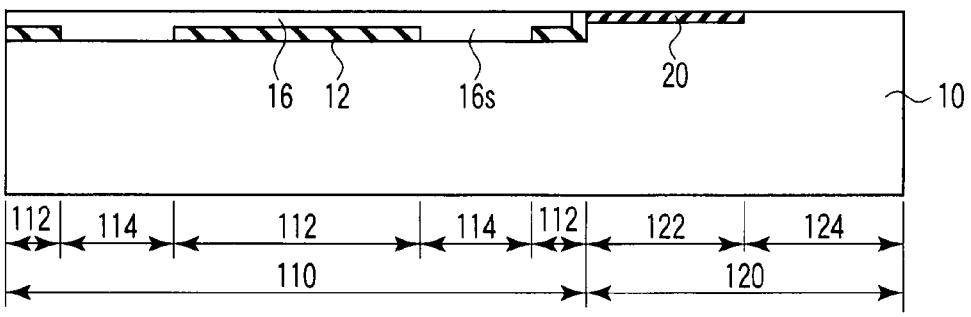
F I G. 3G
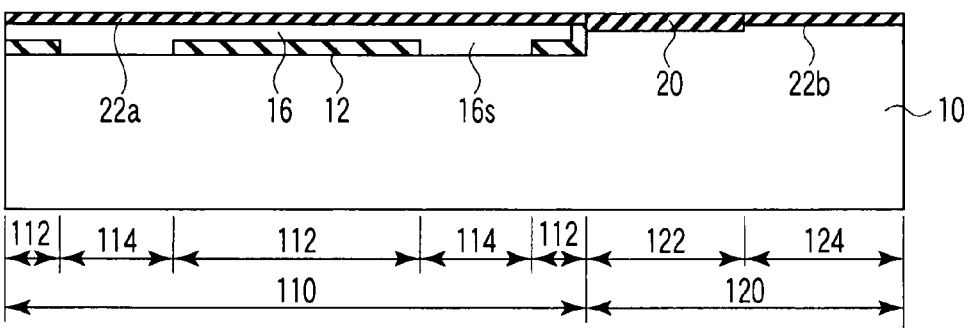
F I G. 3H

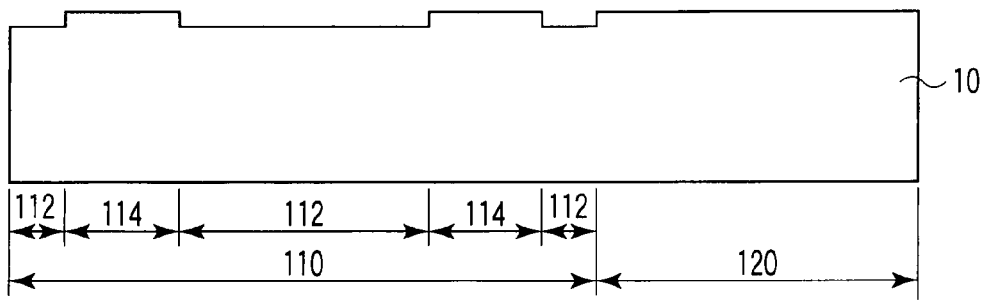
F I G. 5A
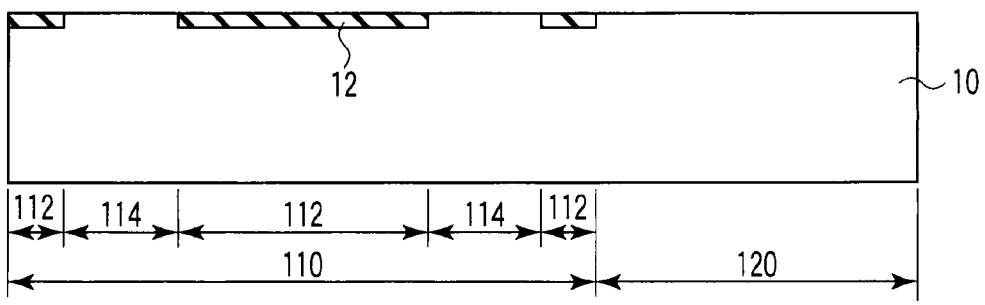
F I G. 5B
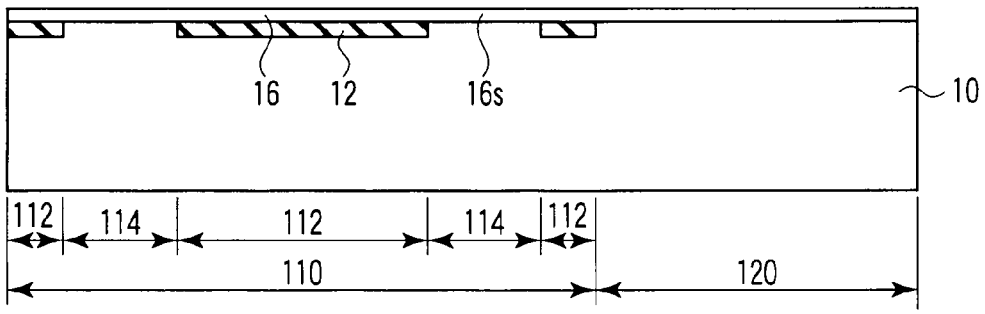
F I G. 5C
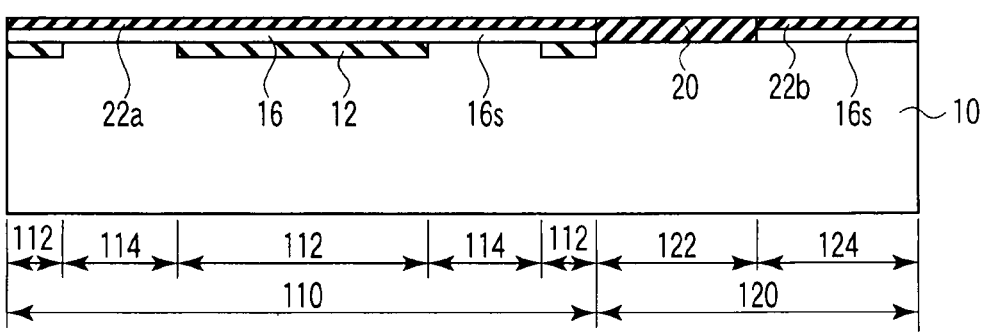
F I G. 5D

SEMICONDUCTOR STORAGE DEVICE AND MANUFACTURING METHOD THEREOF

CROSS-REFERENCE TO RELATED APPLICATIONS

This application is based upon and claims the benefit of priority from prior Japanese Patent Application No. 2007-021170, filed Jan. 31, 2007, the entire contents of which are incorporated herein by reference.

BACKGROUND OF THE INVENTION

1. Field of the Invention

The present invention relates to a semiconductor storage device and a manufacturing method thereof, and more particularly to a semiconductor storage device including a plurality of semiconductor element devices having different functions and a manufacturing method thereof.

2. Description of the Related Art

In a semiconductor storage device, e.g., a flash memory of a NAND or NOR type, each semiconductor element device in the semiconductor storage device has been further miniaturized to realize high integration. However, when miniaturization advances, it has been perceived that a short channel effect of a memory cell transistor that stores information becomes considerable and OFF characteristics are degraded.

As one of methods for solving the short channel effect, there is a semiconductor device that uses a silicon-on-insulator (SOI) substrate having a thin semiconductor layer, e.g., a silicon layer, provided on an insulator. However, the crystallinity of the semiconductor layer provided on the insulator may inferior to the crystallinity of a bulk substrate depending on a manufacturing method thereof. Therefore, in a nonvolatile semiconductor storage device such as a NAND flash memory, a peripheral circuit including a high voltage transistor is desired to be disposed on a bulk substrate having the excellent crystallinity.

A semiconductor device using a partial SOI substrate, which partly includes SOI regions, is disclosed in, e.g., JP-A 2003-203967 (KOKAI). The partial SOI substrate disclosed in this patent document uses a commercially available SOI substrate as a starting material. An SOI layer and a buried insulator, e.g., a buried oxide (BOX) film, are partially removed to expose a silicon substrate surface in order to form a non-SOI region. Then, an epitaxial silicon layer is formed on the exposed silicon substrate to fabricate the partial SOI substrate including an SOI region and the non-SOI region. Then, for example, a logic circuit is formed in the SOI region, and a DRAM and a sense amplifier circuit are formed in the non-SOI region. This technology uses the commercially available SOI substrate as a starting material and hence its cost is high as compared with a case where a bulk silicon substrate is used as a starting material.

Another technology of fabricating a partial SOI substrate without using a commercially available SOI substrate is disclosed in a specification of U.S. Patent Application Laid-open No. 2006/0048702. The technology disclosed in the patent document uses a single crystal region provided in an insulator as a seed crystal. According to this technology, a first epitaxial layer protruding above a surface of the insulator is first provided on the seed crystal. Furthermore, an amorphous silicon layer that covers the first epitaxial layer is deposited on the entire surface, and solid phase epitaxial growth is performed to case a lateral epitaxial growth with the first epitaxial layer being used as a seed to form a second epitaxial layer on the insulator, thereby fabricating the SOI substrate. Subsequently, a single crystal portion protruding on the first epitaxial layer is removed by, e.g., reactive ion etching (RIE), to be planarized.

BRIEF SUMMARY OF THE INVENTION

According to one aspect of the present invention, there is provided a semiconductor storage device comprising: a first semiconductor region provided in a semiconductor substrate including a buried insulator having opening portions; a second semiconductor region provided in the semiconductor substrate without including buried insulator, the second semiconductor region being different from the first semiconductor region; a plurality of first semiconductor element devices disposed above the buried insulator in the first semiconductor region; a plurality of second semiconductor element devices each disposed in a region including a region above the opening portion of the buried insulator in the first semiconductor region; and a plurality of third semiconductor element devices disposed in the second semiconductor region.

According to another aspect of the present invention, there is provided a manufacturing method of a semiconductor storage device, comprising: recessing a first region of a semiconductor substrate to form a first recess; forming an insulator in the first recess; forming opening portions in the insulator in the first region to expose a part of the semiconductor substrate; forming a semiconductor film on the exposed semiconductor substrate and on the insulator; forming a semiconductor layer by epitaxially growing the semiconductor film in the first region using the semiconductor substrate in the opening portions as a seed crystal; recessing a first section in a second region of the semiconductor substrate to form a second recess, the second region being different from the first region; forming a first gate insulator on the semiconductor substrate in the second recess; forming a second gate insulator on the semiconductor layer in the first region and on the semiconductor substrate in a second section in the second region, the second section being different from the first section of the second region; disposing a plurality of first semiconductor element devices above the insulator in the first region and a second semiconductor element device above a region including the opening portion in the first region; and disposing a third semiconductor element device in the first section of the second region and a fourth semiconductor element device in the second section of the second region.

According to another aspect of the present invention, there is provided a manufacturing method of a semiconductor storage device, comprising: recessing a first section in a first region of a semiconductor substrate to form a first recess, wherein a plurality of regions protruded from the first section in the first region are second sections; forming an insulator in the plurality of first recesses; forming a semiconductor film on the semiconductor substrate and on the insulator; forming a semiconductor layer by epitaxially growing the semiconductor film using the semiconductor substrate contacting with the semiconductor film as a seed crystal; recessing the semiconductor layer in a third section in a second region of the semiconductor substrate to form a second recess, the second region being different from the first region; forming a first gage insulator on the semiconductor substrate in the second recess; forming a second gate insulator on the semiconductor layer and semiconductor substrate in the first region and on the semiconductor substrate in a fourth section in the second region, the fourth section being different from the third section of the second region; disposing a plurality of first semiconductor element devices in the first section and a second semiconductor element device in a region including the second section of the first region; and disposing a third semiconductor element device in the third section of the second region and a fourth semiconductor element device in the fourth section of the second region.

BRIEF DESCRIPTION OF THE SEVERAL VIEWS OF THE DRAWING

FIGS. 1A and 1B are plan views for explaining an example of a semiconductor storage device according to a first embodiment of the present invention, in which FIG. 1A is an overall view and FIG. 1B is a magnified view of a memory cell region;

FIGS. 2A to 2C are cross-sectional views for explaining an example of a cross-sectional structure of the semiconductor storage device according to the first embodiment, in which FIG. 2A is a cross-sectional view of memory cells in a chain direction and peripheral element devices taken along a cutting-plane line A-A depicted in FIG. 1B, and FIGS. 2B and 2C are cross-sectional views of the memory cells taken along cutting-plane lines B-B and C-C depicted in FIG. 1B, respectively;

FIGS. 3A to 3H are process cross-sectional views for explaining an example of a manufacturing process of the semiconductor storage device according to the first embodiment;

FIGS. 5A to 5D are process cross-sectional views for explaining an example of a manufacturing process of the semiconductor storage device according to the second embodiment;

DETAILED DESCRIPTION OF THE INVENTION

Figure 1A:
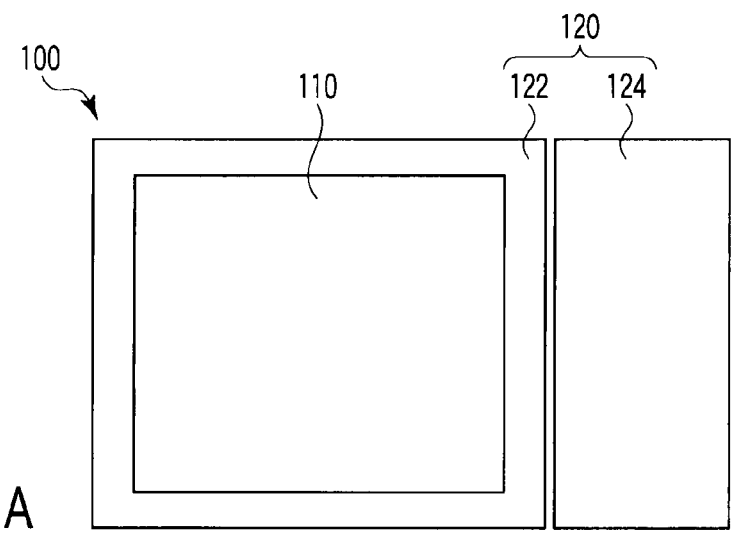

A non-volatile semiconductor storage device, e.g., a NAND flash memory, uses a plurality of semiconductor element devices having different functions, e.g., memory cell transistors (which will be simply referred to as cell transistors hereinafter), select transistors that select the cell transistors, and high voltage transistors and low voltage transistors in a peripheral circuit. These respective semiconductor element devices have different characteristics requirement and different device structures. It is desirable that the cell transistors are disposed in a SOI region to suppress the short channel effect, and the select transistors should be disposed in a non-SOI region because conduction with a well should be achieved in an erase operation. Moreover, it is desirable for the high voltage transistor and the low voltage transistor as peripheral element devices to be disposed on a bulk silicon substrate having the excellent crystallinity to reduce, e.g., a junction leakage current. Additionally, since these transistors have different specifications, their gate insulator thicknesses are not equal thickness each other. On the other hand, in process integration, since precise flatness of a substrate surface is required in a process, e.g., chemical mechanical polishing (CMP) or photolithography, it is desirable for each interface between a gate insulator and a gate electrode provided thereon to have the same height level for all the semiconductor element devices.

Embodiments of the present invention disclose a semiconductor storage device, and a manufacturing method thereof. The semiconductor storage device includes a plurality of semiconductor element devices having different functions. The device has a structure that levels of interfaces between gate insulators and gate electrodes of respective semiconductor element devices are substantially the same and the respective semiconductor element devices are arranged in appropriate regions of a partial SOI substrate.

Although the embodiments explained in this specification are examples of a semiconductor storage device that satisfies different requirements of the plurality of semiconductor element devices, the present invention is not limited to these embodiments.

The embodiments of the present invention will be described with reference to the accompanying drawings. The accompanying drawings, which are incorporated in and constitute a part of the specification, illustrate embodiments of the invention, and together with the general description given above and the detailed description of the embodiments given below, serve to explain principles of the invention. Throughout the drawings, corresponding portions are denoted by corresponding reference numerals. The embodiments are only examples, and various changes and modifications can be made without departing from the scope and spirit.

First Embodiment

Figure 1B:
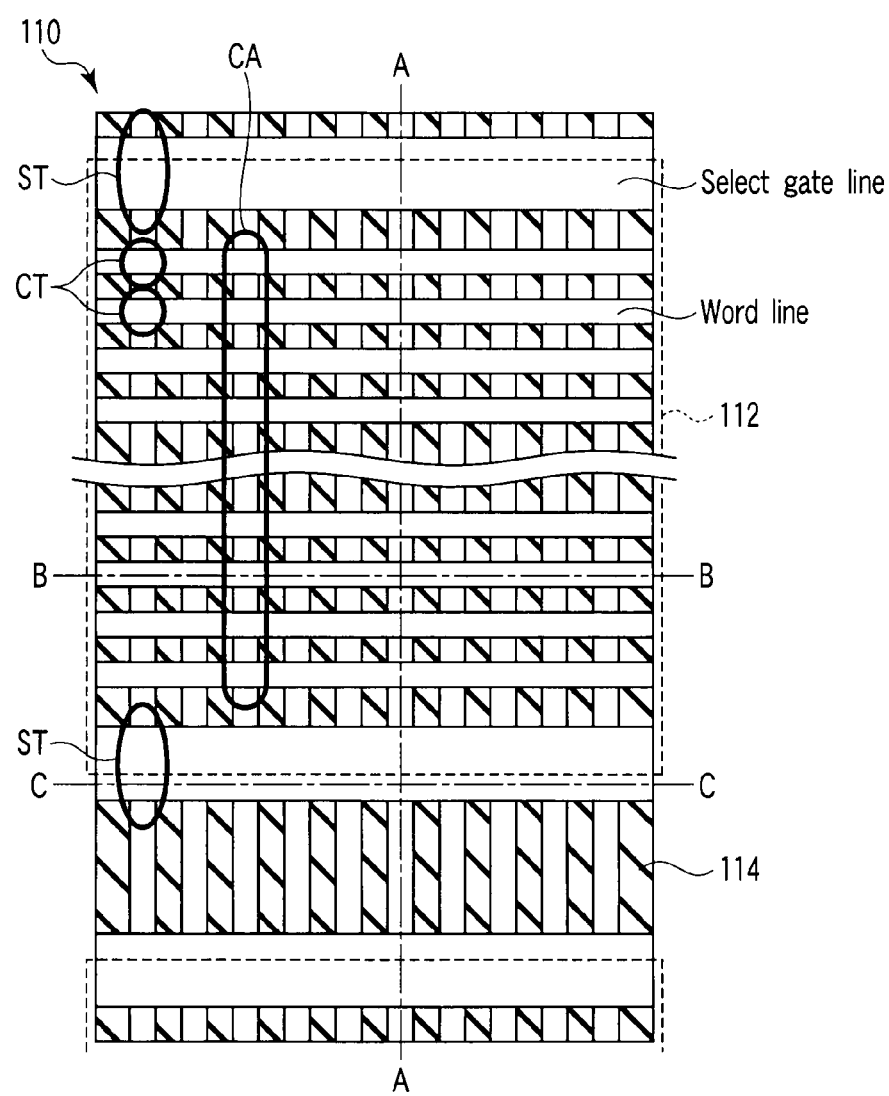

A semiconductor storage device and a manufacturing method thereof according to a first embodiment of the present invention will now be explained while taking a non-volatile semiconductor storage device as an example. FIGS. 1A and 1B are plan views for explaining an example of a non-volatile semiconductor storage device 100 according to this embodiment, e.g., a NAND flash memory, wherein FIG. 1A is an overall view and FIG. 1B is a magnified view of a memory cell region.

The NAND flash memory 100 includes a memory cell region 110 and a peripheral circuit region 120, and the peripheral circuit region 120 includes a high voltage transistor section 122 and a low voltage transistor section 124. As shown in FIG. 1B, a memory cell MC includes memory cell arrays CA each of which includes a plurality of cell transistors CT serially connected in a chain in a vertical direction in the drawing and each select transistor ST that is arranged at each end of each memory cell array CA and selects corresponding memory cell array. The memory cell region 110 is provided in an SOI region which includes an SOI section 112 having a buried insulator, e.g., a buried oxide (BOX) film, and each opening area 114 having no BOX film. The region 112 surrounded by a broken line in FIG. 1B is the SOI section with a BOX film 12, and each memory cell array CA is disposed in this SOI section 112. A control gate electrode (see 28c in FIGS. 2A and 2B) of each cell transistor CT connects a plurality of cell transistors CT in other memory cell arrays arranged in a lateral direction in the drawing and serves as a word line. Each select transistor ST is disposed in a region including the opening area 114 in the memory cell region 110. The opening area 114 functions as a seed crystal when crystallizing an SOI layer to a single crystal. The opening area 114 may be not only provided in a part corresponding to the select transistor ST but also a part below the memory cell transistors CT. A gate electrode (see 28s in FIG. 2A) of each select transistor ST connects a plurality of select transistors ST arranged in the lateral direction in the drawing and serves as a select gate line.

FIGS. 2A to 2C are cross-sectional views for explaining an example of a cross-sectional structure of the NAND flash memory 100 according to this embodiment. FIG. 2A is a view for explaining a cross-sectional structure of the memory cell MC and the peripheral circuit 120. The memory cell MC is shown in a cross-sectional view along a chain direction of the memory cell array CA taken along a cutting-plane line A-A depicted in FIG. 1B, and the peripheral circuit 120 include a high voltage transistor HT and a low voltage transistor LT. FIGS. 2B and 2C are cross-sectional views in a direction vertical to the chain direction of the memory cell array CA, in which FIG. 2B is a cross-sectional view of the cell transistor CT in a word line direction taken along a cutting-plane line B-B depicted in FIG. 1B and FIG. 2C is a cross-sectional view of the select transistor ST in a select gate line direction taken along a cutting-plane line C-C depicted in FIG. 1B. In the drawings, a gate-side wall, an extension of a source/drain diffusion layer, and others are omitted for simplification. This is also applied to other cross-sectional views. As shown in FIGS. 2B and 2C, the cell transistors CT and the select transistors ST adjacent to each other in the word line direction of the memory cell are electrically separated from each other by isolations 40.

As shown in FIG. 2A, the NAND flash memory 100 according to this embodiment is provided on a partial SOI substrate including the SOI region 110 and the non-SOI region 120, and each memory cell array CA is disposed in the SOI section 112 in the SOI region 110.

The SOI region 110 as the memory cell region includes the SOI section 112 and an opening area 114. The SOI section 112 includes a semiconductor layer 16, e.g., a silicon layer (SOI layer), provided on a buried insulator 12, e.g., a buried oxide (BOX) film, on a semiconductor substrate 10, e.g., a silicon substrate, and the opening area 114 including a silicon layer 16s provided in an opening portion of the BOX film 12. Each cell transistor CT disposed in the SOI section 112 in the memory cell region 110 includes a gate insulator 22a functioning as a tunnel insulator formed on the SOI layer 16, a floating gate electrode 24 that stores electric charges, an inter-electrode insulator 26, and a control gate electrode 28c. The cell transistors CT adjacent to each other in the chain direction are electrically connected through a diffusion layer 32 provided in the SOI layer 16. Each select transistor ST disposed in a region including the opening area 114 includes the gate insulator 22a, a gate electrode in which a floating gate electrode 24s and a control gate electrode 28s are connected, and source/drain diffusion layers 34. One of the source/drain diffusion layers 34 of the select transistor ST is disposed in the opening area 114.

The high voltage transistor HT provided in the peripheral circuit region 120 includes a gate insulator 20 formed on the semiconductor substrate 10, a gate electrode 30, and source/drain diffusion layers 36. The low voltage transistor LT includes a gate insulator 22b formed on the semiconductor substrate 10, the gate electrode 30, and source/drain diffusion layers 38. A thickness of the gate insulator 20 of the high voltage transistor HT is thicker than those 22a, 22b of other transistors CT, ST, and LT.

Moreover, in each of the cell transistor CT and the select transistor ST of the memory cell and each of the high voltage transistor HT and the low voltage transistor LT of the peripheral circuit, interfaces between the gate insulators 22a, 20, and 22b and the gate electrodes 24 and 30 being provided thereon have substantially the same height level. Adopting this structure facilitates the process integration of a semiconductor device manufacturing process of gate electrode formation and thereafter.

Specifically, in the memory cell region 110, the semiconductor substrate 10, e.g., a silicon substrate, is recessed by an amount corresponding to a thickness of the sum of the BOX film 12 and the SOI layer 16 to form the SOI structure. Additionally, since the gate insulator 20 of the high voltage transistor HT generally has a larger thickness than others 22a and 22b, as described above, the high voltage transistor section 122 in the peripheral circuit region 120 is recessed by an amount corresponding to a film thickness difference between the gate insulator 20 of the high voltage transistor and the gate insulator 22b of the low voltage transistor. Using the partial SOI substrate having such a structure enables realizing the NAND flash memory 100 in which the interfaces between the gate insulators 20, 22a, and 22b of the respective transistors and the gate electrodes 24 and 30 have substantially the same level.

In the NAND flash memory 100 according to this embodiment, the high voltage transistor HT and the low voltage transistor LT of the peripheral circuit are disposed in the non-SOI region 120, i.e., on the bulk semiconductor substrate 10. This structure is adopted in order to realize excellent transistor characteristics, e.g., a small junction leakage current, and to enable application of a substrate bias in its operation, by providing the peripheral element devices on the bulk substrate having the excellent crystallinity.

Further, in this embodiment, to improve the crystallinity of the SOI layer 16 in the memory cell region 110, the opening areas 114 are provided in the BOX film 12 to expose the semiconductor substrate 10, and the semiconductor substrate 10 in the area is used as a seed crystal when the SOI layer 16 is crystallized by solid phase epitaxial growth. It is preferable to set an interval between the openings 14 to 4 to 5 μm, for example. The interval of this value allows the SOI layer 16 to have an excellent crystallinity when crystallizing an amorphous silicon layer deposited on the BOX film 12 into a single crystal. Although a range of the interval where the SOI layer 16 is crystallized to have the excellent crystallinity can be varied depending on, e.g., an amorphous silicon deposition method and/or solid phase epitaxial growth conditions, it is, e.g., approximately 4 to 5 μm.

As explained above, in the select transistor ST of the memory cell MC, it is preferable to provide one of the diffusion layer 34 on the non-SOI layer, i.e., in the opening area 114. That is because the diffusion layer of the select transistor ST needs to be conducted with a well (not shown) provided in the semiconductor substrate 10 since a well potential rather than a bit line potential needs to be transferred to the memory cells in a batch erase operation. Further, it is preferable to provide each cell transistor CT on the SOI layer 16 to suppress a short channel effect. Therefore, as explained above, the NAND flash memory satisfying respective requirement of its element devices is provided by disposing the diffusion layer 34 of the select transistor ST in the solid phase epitaxial layer 16s in the opening area 114 and disposing the memory cell array CA on the SOI layer 16 in the SOI section 112 in the memory cell region 110, respectively.

In this manner, according to this embodiment, it is possible to provide the semiconductor storage device 100 using the partial SOI substrate, the device 100 includes a plurality of types of semiconductor element devices, e.g., the cell transistors CT and select transistors ST in the memory cell, and the high voltage transistor HT and low voltage transistors LT in the peripheral circuit. This semiconductor storage device 100 can be formed in such a manner that the interfaces between the gate insulators 20, 22a, and 22b and the gate electrodes 24 and 30 of the respective semiconductor element devices have substantially the same level. To realize this structure, the interface between the semiconductor substrate 10 and the gate insulator 20 of the high voltage transistor HT is formed lower than that of the low voltage transistor LT. Furthermore, the respective transistors can be disposed in appropriate regions in accordance with requirements for respective element characteristics. For example, the memory cell transistors CT can be disposed in the SOI region 112, the select transistors ST can be disposed in the region including each opening area 114 of the SOI region, and the high voltage transistor HT and low voltage transistor LT may be disposed in the bulk substrate region 120.

A manufacturing method of the semiconductor storage device 100 according to this embodiment will now be explained with reference to process cross-sectional views of FIGS. 3A to 3H. These drawings are views including cross sections of the regions where the respective semiconductor element devices are formed like FIG. 2A.

(1) Referring to FIG. 3A, to provide the SOI structure to the memory cell region 110 where the memory cell is to be formed, the semiconductor substrate 10, e.g., a silicon substrate, in the memory cell region 110 is recessed to form a first recess. At this step, although not shown, a first mask is used. The depth E1 of the first recess can be represented by the following expression:

$$E1 = t_{Si} + t_{BOX} + (t_{Ox1} + t_{Ox2})/c + a,$$

where $t_{BOX}$ is a thickness of the BOX film 12 of the SOI, $t_{Si}$ is a thickness of the final SOI layer (a silicon layer), $t_{Ox1}$ is a thickness of the gate insulator 20 of the high voltage transistor HT, $t_{Ox2}$ is a thickness of each of the gate insulators 22a and 22b of the memory cell region MC and the low voltage transistor LT, c is a transformation coefficient in a thickness direction when the silicon substrate is changed to a silicon oxide film by thermal oxidation, and a is an amount of removal by CMP at a later step (5). For example, assuming that $t_{Si}$=5 to 100 nm, $t_{BOX}$=10 to 200 nm, $t_{Ox1}$=20 to 60 nm, and $t_{Ox2}$=3 to 9 nm, c=2.22, and a=10 to 200 nm, the depth of the first recess is estimated to E1=75.6 to 651.8 nm.

(2) Referring to FIG. 3B, an insulator 12, e.g., a silicon oxide film, for the BOX film is formed on the entire surface. This insulator 12 can be formed by, e.g., thermal oxidation of the silicon substrate 10 or chemical vapor deposition (CVD). Besides the silicon oxide film, for example, a silicon nitride film can be used as the insulator 12. Here, the silicon oxide film is taken as an example of the insulator 12. The thickness $t_{BOX}$ of the BOX film varies depending on a design of the semiconductor device, it is, e.g., $t_{BOX}$=10 to 200 nm.

(3) Referring to FIG. 3C, the insulator 12 in each opening area 114 in the memory cell region 110 is removed to expose the silicon substrate 10. In this step, although not shown, a second mask is used. The silicon substrate 10 in this opening area 114 serves as a seed crystal when crystallizing the SOI layer to a single crystal at the later step (5). It is preferable to provide the opening areas 114 at intervals of, e.g., 4 to 5 μm, in order to improve the crystallinity of the SOI layer.

(4) Referring to FIG. 3D, an amorphous semiconductor film 16a, e.g., amorphous silicon, formed of the same material as the semiconductor substrate 10 is deposited on the entire surface by, e.g., CVD. A film thickness $t_{aSi}$ of the amorphous silicon 16a is represented as follows;

$$t_{aSi} \geq (1-d) \times E1,$$

where d is a volume shrinkage rate when crystallizing the amorphous silicon 16a.

(5) Then, crystallization annealing is performed at, e.g., 700 to 1150° C. As a result, the amorphous silicon 16a in the memory cell region 110 is crystallized to single crystal silicon through solid phase epitaxial growth using the silicon substrate 10 in each opening area 114 as the seed crystal. Thereby, the SOI layer 16 is formed on the BOX film 12 in the SOI section 112, and the solid phase epitaxial layer 16s is formed in the opening area 114.

Moreover, as shown in FIG. 3E, planarization is performed by, e.g., CMP until the surface of the silicon substrate 10 in the peripheral circuit region 120 is exposed. Alternatively, the amorphous silicon 16a is deposited rather thickly, planarization can be carried out by combining CMP with isotropic etching, for example. As a result, the entire surfaces of the peripheral circuit region 120 and the memory cell region 110 including the solid phase epitaxial layer 16a on each opening area 114 are planarized.

(6) Referring to FIG. 3F, the silicon substrate 10 in the high voltage transistor section 122 of the peripheral circuit region 120 is recessed to form a second recess. At this step, although not shown, a third mask is used. The depth E2 of the second recess is represented as follows:

$$E2 = t_{Ox1} \times (1-1/c),$$

where $t_{Ox1}$ is the gate insulator thickness of the high voltage transistor HT and is, e.g., $t_{Ox1}$=20 to 60 nm, and c is a transformation coefficient in the thickness direction when the silicon substrate is changed to a silicon oxide by thermal oxidation.

(7) Then, the high voltage gate insulator 20, e.g., a silicon oxide film, is formed on the entire surface by thermal oxidation. Then, as shown in FIG. 3G, the high voltage gate insulator 20 in regions other than the high voltage transistor section 122 is removed to expose the SOI layer 16 in the memory cell region 110 and the silicon substrate 10 in the low voltage transistor section 124. At this step, although not shown, a fourth mask is used.

(8) Referring to FIG. 3H, the gate insulators 22a and 22b, e.g., silicon oxide films, of the memory cell transistor, select transistor and low voltage transistor are formed on the entire surface by, e.g., thermal oxidation. A thickness of this gate insulator 22 is, e.g., $t_{Ox2}$=3 to 9 nm. The gate insulators 22a and 22b may be formed simultaneously or at different steps.

In this manner, the partial SOI substrate in which the memory cell region 110 has the SOI structure including the opening areas 114 and the peripheral circuit region 120 is the bulk silicon substrate 10 can be formed. Furthermore, the surface of the gate insulator 22a in the memory cell region 110 and the surfaces of the high voltage gate insulator 20 and the low voltage gate insulator 22b in the peripheral circuit region 120 can be formed to have substantially the same level. To realize this structure, the interface between the semiconductor substrate 10 and the gate insulator 20 of the high voltage transistor HT becomes lower than that of the low voltage transistor LT. The number of masks required at the above-explained steps is four.

(9) Thereafter, as shown in FIG. 2A, each cell transistor CT including a floating gate electrode 24, an inter-electrode insulator 26, and a control gate electrode 28c and each select transistor ST having a gate electrode in which the floating electrode 24s is connected with the control gate electrode 28s are formed in the memory cell region 110. The cell transistor CT is disposed in the SOI section 112 having the BOX film 12, and the select transistor ST is disposed in such a manner that one source/drain diffusion layer 34 is placed in the solid phase epitaxial layer 16s on the opening area 114.

Moreover, the high voltage transistor HT and the low voltage transistor LT including the gate electrodes 30 are provided on the bulk semiconductor substrate 10 in the peripheral circuit region 120.

In this manner, each transistor in the semiconductor storage device according to this embodiment can be formed.

Furthermore, the semiconductor storage device 100 according to this embodiment is to be completed through steps required for the semiconductor storage device, e.g., multilevel wiring.

As explained above, in the semiconductor storage device 100, e.g., the NAND flash memory, according to this embodiment, the plurality of semiconductor element devices having different functions, e.g., the memory cell transistors CT and select transistors ST in the memory cell region 110 and the high voltage transistor HT and low voltage transistor LT in the peripheral circuit region 120, are respectively arranged in the appropriate regions of the partial SOI substrate. As a result, characteristics required for the respective semiconductor element devices can be achieved. Specifically, each cell transistor CT is disposed in the SOI section 112 to suppress the short channel effect. Each select transistor ST is disposed in the non-SOI section (the opening area) 114 adjacent to the SOI section 112 to enable achieving conduction with a well in an erase operation. Further, the high voltage transistor HT and the low voltage transistor LT in the peripheral circuit are disposed on the bulk silicon substrate 10 having excellent crystallinity. Thereby, even if the crystallinity of the SOI layer 16 is not good enough, these peripheral transistors can be avoided from problems, e.g., increase in junction leakage current, degradation of junction breakdown voltage, or degradation of gate insulator breakdown voltage, due to the not good crystallinity.

Furthermore, in the semiconductor storage device 100 according to this embodiment, since the surface of the gate insulator 22a in the memory cell region 110 and the surfaces of the high voltage gate insulator 20 and the low voltage gate insulator 22b in the peripheral circuit region 120 are formed to be substantially the same level, the process integration of the gate electrode forming process and subsequent manufacturing processes can be facilitated. To realize this structure, the interface between the semiconductor substrate 10 and the gate insulator 20 of the high voltage transistor HT is formed lower than that of the low voltage transistor LT.

Therefore, according to the embodiment, there is provided a semiconductor storage device in which the plurality of semiconductor element devices having different functions are included, the interface between each gate insulator and each gate electrode is formed to be the same level, and each semiconductor element device is disposed in the appropriate region of the partial SOI substrate, and a manufacturing method thereof.

Second Embodiment

Figure 4:
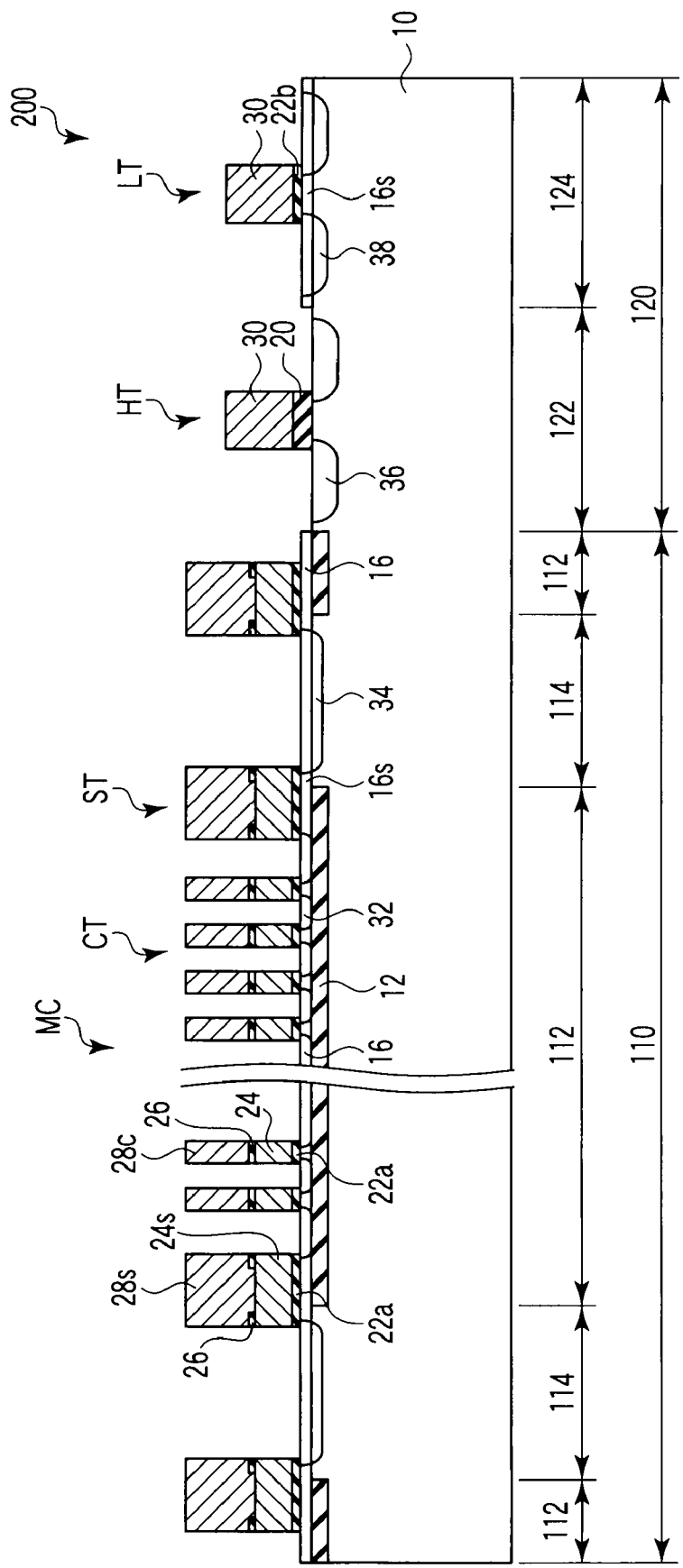
FIG. 4 is cross-sectional views for explaining an example of a cross-sectional structure of the semiconductor storage device according to a second embodiment of the present invention.

FIG. 4 shows an example of a cross-sectional structure of a semiconductor storage device 200, e.g., a NAND flash memory, according to a second embodiment. A NAND flash memory 200 according to this embodiment is provided on a partial SOI substrate including an SOI section 112 where each memory cell array is arranged. Cell transistors CT and select transistors ST are disposed in a memory cell region 110. Furthermore, a high voltage transistor HT and low voltage transistor LT are disposed in a peripheral circuit region 120.

A structure of each transistor is the same as that in the first embodiment, thereby omitting an explanation thereof.

Each cell transistor CT is disposed on an SOI layer 16 in the SOI section 112 in the memory cell region 110 of an SOI region, and each select transistor ST is disposed in such a manner that one source/drain diffusion layer 34 is formed in a solid phase epitaxial layer 16s in an opening area 114 adjacent to the SOI section 112. The high voltage transistor HT in the peripheral circuit is disposed on a bulk semiconductor substrate 10 in the peripheral circuit region 120 of a non-SOI region, and the low voltage transistor LT is disposed on the solid phase epitaxial layer 16s in the peripheral circuit region 120.

Arranging the respective transistors in this manner enables satisfying required characteristics of the respective transistors. For example, each cell transistor CT disposed in the SOI section 112 can suppress a short channel effect, and each select transistor ST disposed in the region including the opening area 114 in the SOI region can achieve conduction between one of sources/drains 34 and a well (not shown) and hence can supply well potential in a batch erase operation of the memory cells. Moreover, an active region of the high voltage transistor HT can be formed in the bulk semiconductor substrate 10 having the good crystallinity and improve transistor characteristics of, e.g., junction leakage current.

Additionally, interfaces between gate insulators 22a, 20, and 22b and gate electrodes 24 and 30 of the respective transistors are formed to have substantially the same level. As a result, process integration in the gate electrode forming process and subsequent manufacturing processes can be facilitated.

A manufacturing method of the semiconductor storage device 200 according to this embodiment will now be explained with reference to process cross-sectional views of FIGS. 5A to 5D. These drawings are views including cross sections of regions where the respective semiconductor element devices are formed like FIG. 4.

(1) Referring to FIG. 5A, to form an SOI structure to the SOI section 112 in the memory cell region 110, the semiconductor substrate 10, e.g., a silicon substrate, in a plurality of SOI sections 112 is recessed to form a plurality of first recesses. The depth E3 of the first recess is as follows:

$$E3 = t_{BOX} + a,$$

where $t_{BOX}$ is a BOX film thickness and a is a amount of removal at a planarizing step explained later. At this step, although not shown, a first mask is used. In this embodiment, each opening area 114 that becomes a seed crystal is left to protrude, i.e., in a mesa shape without being recessed. The opening area 114 is used as a seed crystal when the SOI layer is crystallized by solid phase epitaxial growth in a latter step. Like the first embodiment, it is preferable to set an interval of the opening areas 114 to 4 to 5 μm, in order to form single crystal silicon layer having the excellent crystallinity on the BOX film in solid phase epitaxial growth at a later step (3).

(2) Then, an insulator, e.g., a silicon oxide film, that becomes the BOX film 12 is formed on the entire surface by thermal oxidation. Then, as shown in FIG. 5B, the entire surface is planarized by, e.g., CMP. As a result, surfaces of the silicon substrate 10 of the opening area 114 and the BOX film 12 in the memory cell region 110 and a surface of the silicon substrate 10 of the peripheral circuit region 120 have substantially the same level.

(3) Subsequently, amorphous silicon is deposited on the entire surface by, e.g., CVD. The film thickness $t_{aSi}$ of the amorphous silicon deposited is as follows;

$$t_{aSi}=(1-d)\times(t_{Si}+(t_{Ox1}+t_{Ox2})/c),$$

where d is a volume shrinkage rate when crystallizing the amorphous silicon, $t_{Si}$ is the thickness of the SOI layer 16, $t_{Ox1}$ is the thickness of the gate insulator 20 of the high voltage transistor, $t_{Ox2}$ is the thickness of each of the gate insulators 22a and 22b in the memory cell region and of the low voltage transistor LT, and c is an transformation coefficient in a thickness direction when changing the silicon substrate into a silicon oxide by thermal oxidation.

Further, crystallization annealing is performed and solid phase epitaxial growth is carried out while using the silicon substrate 10 in contacting with the amorphous silicon layer as a seed crystal, thereby transforming the amorphous silicon into single crystal silicon. Thus, the SOI layer 16 is formed on the BOX film 12 (FIG. 5C). As a result, a solid phase epitaxial layer 16s is formed in both the opening area 114 and the peripheral circuit region 120 on the bulk silicon substrate 10.

Thereafter, steps including formation of the second recess in the solid phase epitaxial layer 16s in the high voltage transistor section 122 like the step (6) to formation of the gate insulators 22a and 22b at the step (8) in the first embodiment are carried out to form a structure depicted in FIG. 5D. Although not explained in detail in this embodiment, the number of the masks required at these steps is two like the first embodiment. Therefore, the number of total masks required from the beginning to this step of forming the gate insulators is three, which is less than that in the first embodiment by one, thereby realizing simplification of processes and a reduction in a manufacturing cost. Furthermore, a channel of the high voltage transistor HT is formed in the bulk silicon substrate. Therefore, even if the crystallinity of the SOI layer 16 is not good enough, these peripheral transistors can be avoided from problems, e.g., increase in junction leakage current, degradation of junction breakdown voltage, or degradation of gate insulator breakdown voltage, due to this not good crystallinity.

Furthermore, gate electrodes of the cell transistors CT, the select transistors ST, the high voltage transistor HT, and the low voltage transistor LT are formed, thereby completing the NAND flash memory 200 according to this embodiment as depicted in FIG. 4.

As explained above, in the semiconductor storage device 200, e.g., the NAND flash memory according to this embodiment, the plurality of semiconductor element devices having different functions, e.g., the memory cell transistors CT and select transistors ST in the memory cell region 110 and the high voltage transistor HT and low voltage transistor LT in the peripheral circuit region 120, are arranged in the appropriate regions of the partial SOI substrate, respectively. As a result, characteristics required for the respective semiconductor element devices are achieved. Specifically, each cell transistor CT is disposed in the SOI section 112 to suppress the short channel effect. Each select transistor ST is disposed in each non-SOI area (each opening area) 114 adjacent to the SOI section 112 to enable achieving conduction with a well in an erase operation. Moreover, the high voltage transistor HT and low voltage transistor LT in the peripheral circuits are disposed on the bulk silicon substrate 10 having the excellent crystallinity or the solid phase epitaxial layer 16s. Even if the crystallinity of the SOI layer 16 is not good enough, these peripheral transistors can be avoided from problems, e.g., increase in junction leakage current, degradation of junction breakdown voltage, or degradation of gate insulator breakdown voltage, due to this not good crystallinity.

Additionally, in the semiconductor storage device 200 according to this embodiment, since the surface of the gate insulator 22a in the memory cell region 110 and the surfaces of the high voltage gate insulator 20 and low voltage gate insulator 22b in the peripheral circuit region 120 are formed to have substantially the same level, the process integration of the gate electrode forming process and subsequent manufacturing processes can be facilitated. To realize this structure, the interface between the semiconductor substrate 10 and the gate insulator 22 of the high voltage transistor HT is lower than the interface between the solid phase epitaxial layer 16s and the gate insulator 22b of the low voltage transistor LT.

Therefore, according to the embodiment, there is provided a semiconductor storage device in which the plurality of semiconductor element devices having different functions are included, the interface between each gate insulator and each gate electrode is formed to be the same level, and each semiconductor element device is disposed in the appropriate region of the partial SOI substrate, and a manufacturing method thereof.

Third Embodiment

Figure 6:
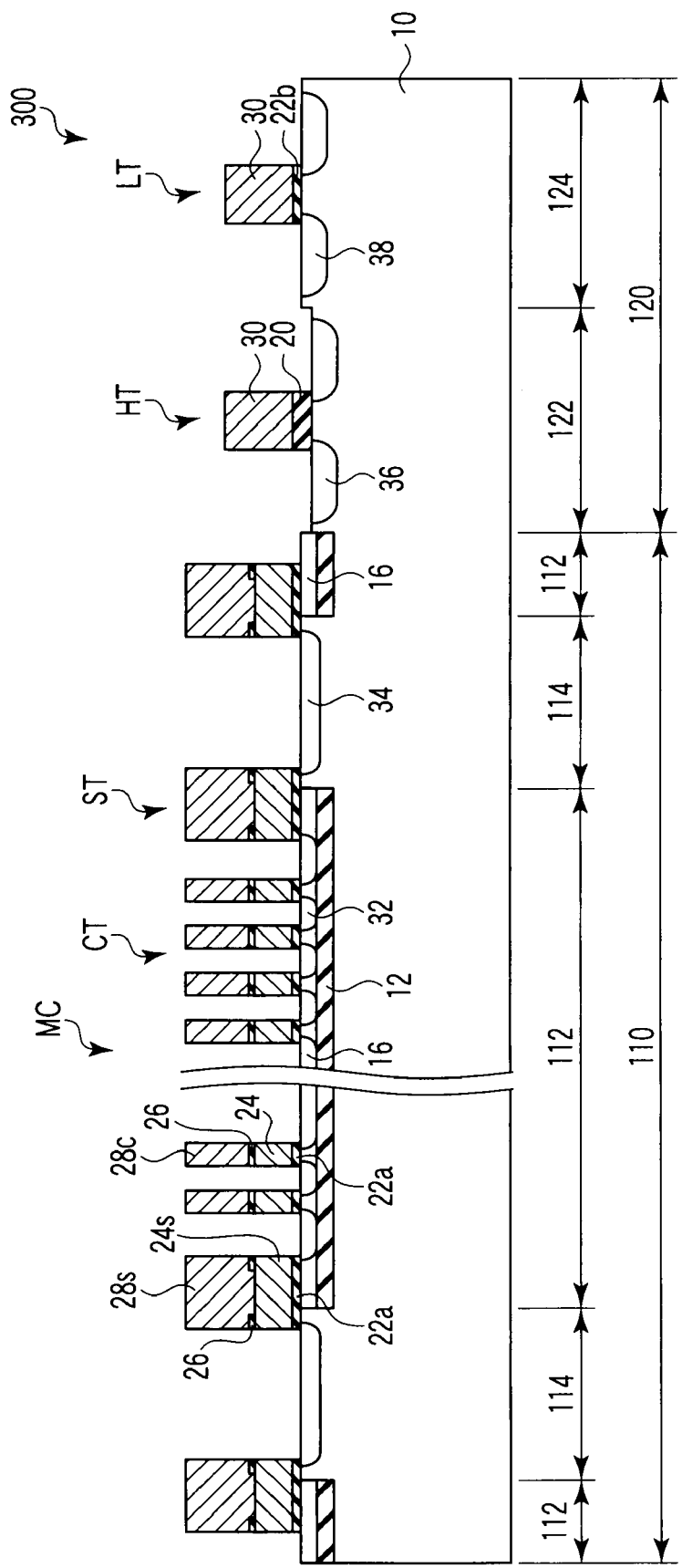
FIG. 6 is cross-sectional views for explaining an example of a cross-sectional structure of the semiconductor storage device according to a third embodiment of the present invention.

FIG. 6 shows an example of a cross-sectional structure of a semiconductor storage device 300, e.g., a NAND flash memory according to a third embodiment of the present invention. Although the NAND flash memory 300 is similar to the second embodiment, it is a semiconductor storage device in which each select transistor ST, a high voltage transistor HT, and a low voltage transistor LT are all disposed on a bulk semiconductor substrate 10 and each cell transistor CT is disposed on an SOI layer 16 in an SOI section 112.

A structure of each transistor is the same as that in the first embodiment, thereby omitting an explanation thereof.

In this embodiment, likewise, interfaces between gate insulators 20 and 22 and gate electrodes 24 and 30 of the respective transistors are formed to have the same level. As a result, process integration of a gate electrode forming process and subsequent manufacturing processes can be facilitated. To realize this structure, an interface between the semiconductor substrate 10 and the gate insulator 20 of the high voltage transistor HT is formed lower than an interface between the same of the low voltage transistor LT.

A manufacturing method of the semiconductor storage device 300 according to this embodiment will now be explained with reference to process cross-sectional views of FIGS. 7A to 7F. These drawings are views including cross sections of regions in which the respective semiconductor element devices are formed like FIG. 6.

Figure 7A:
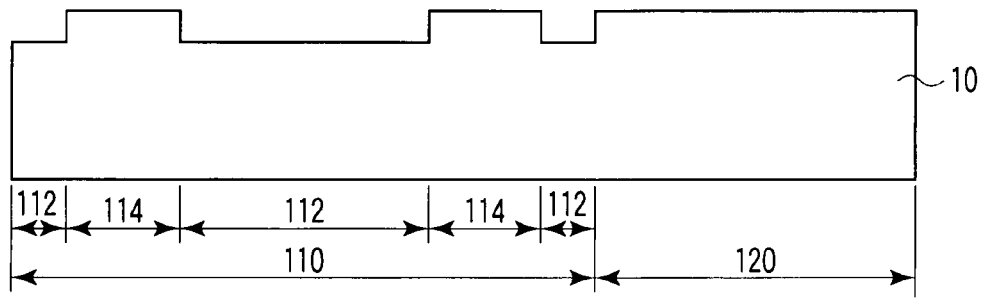
FIGS. 7A to 7F are process cross-sectional views for explaining an example of a manufacturing process of the semiconductor storage device according to the third embodiment.

(1) Referring to FIG. 7A, to form an SOI structure to the SOI section 112 in a memory cell region 110, the semiconductor substrate 10, e.g., a silicon substrate, in a plurality of SOI sections 112 is recessed to form a plurality of first recesses. The depth E4 of the first recess is larger than that in the second embodiment, and it is represented as follows:

$$E4>t_{BOX}+t_{Si},$$

where $t_{BOX}$ is a BOX film thickness, and $t_{Si}$ is a thickness of the SOI layer. At this step, although not show, a first mask is used. In this embodiment, each opening area 114 that becomes a seed crystal at the time of solid phase epitaxial growth of the SOI layer is left to protrude, i.e., in a mesa shape like the second embodiment, but it is formed higher than that in the second embodiment. It is preferable to set an interval of the opening areas 114 to 4 to 5 μm to form single crystal silicon having the excellent crystallinity on the BOX film in solid phase epitaxial growth at a later step like the first embodiment.

Figure 7B:
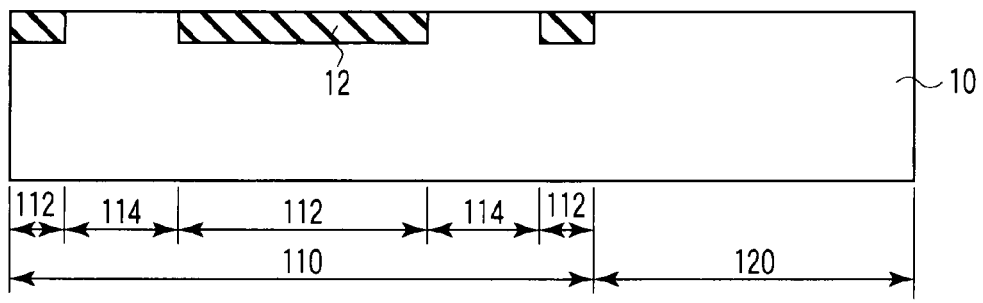

(2) Then, an insulator, e.g., a silicon oxide film, that becomes the BOX film 12 is formed on the entire surface by thermal oxidation. The BOX film 12 is formed to completely fill the first recess in the silicon substrate 10 formed at the step (1). Further, as shown in FIG. 7B, the entire surface is planarized by, e.g., CMP. As a result, a surface of the semiconductor substrate 10 including each opening area 114 in the SOI region 110 and a surface of the BOX film 12 have substantially the same level.

Figure 7C:
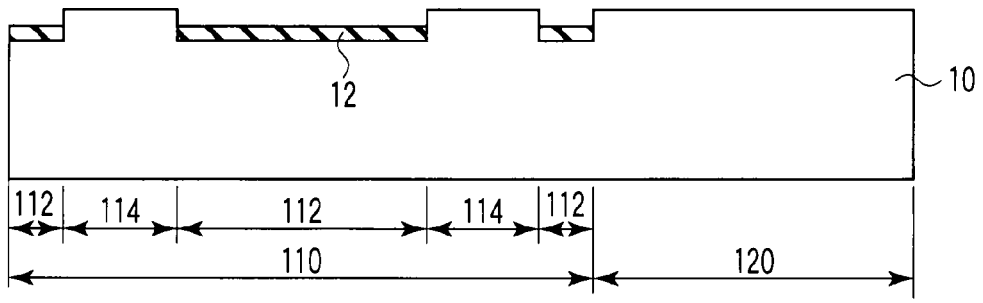

(3) Furthermore, as shown in FIG. 7C, the BOX film 12 is etched back to be left the BOX film 12 having a predetermined thickness in the SOI section 112.

(4) Subsequently, amorphous silicon is deposited on the entire surface by, e.g., CVD. A film thickness $t_{aSi}$ of the amorphous silicon deposited is as follows;

$$t_{aSi} \geq (1-d) \times t_{Si},$$

where d is a volume shrinkage rate when crystallizing the amorphous silicon and $t_{Si}$ is the thickness of the SOI layer 16.

Figure 7D:
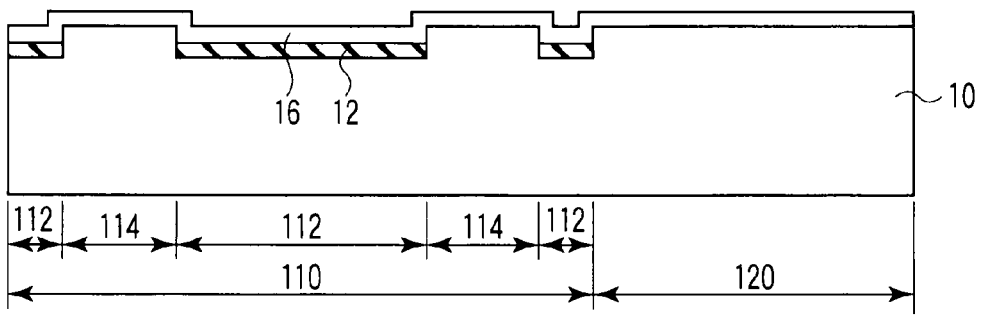

Moreover, crystallization annealing is performed, and single crystal silicon is grown through solid phase epitaxial growth using the semiconductor substrate 10 contacting with the amorphous silicon as a seed crystal, thereby forming the SOI layer 16 (FIG. 7D).

Figure 7E:
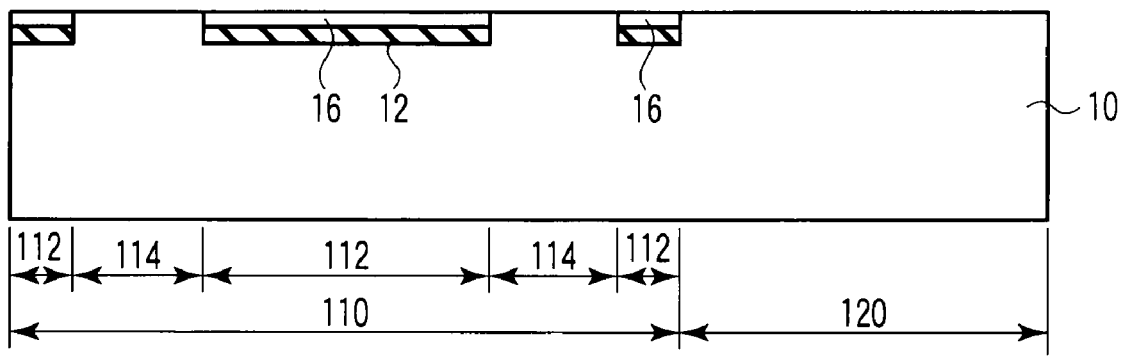

(5) Then, as shown in FIG. 7E, planarization is carried out by, e.g., CMP, to expose the surface of the bulk semiconductor substrate 10 except the SOI section 112.

Figure 7F:
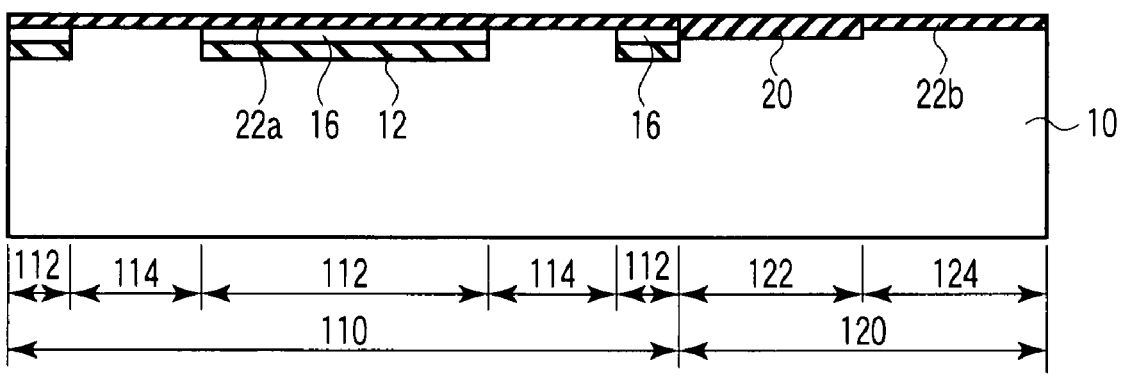

Thereafter, like the second embodiment, steps including formation of the second recess in the silicon substrate 10 in the high voltage transistor section 122 at the step (6) to formation of the gate insulators 22a and 22b at the step (8) in the first embodiment are carried out, thereby forming a structure depicted in FIG. 7F.

Furthermore, gate electrodes of the cell transistors CT, the select transistors ST, the high voltage transistor HT, and the low voltage transistor LT are formed, thereby completing the NAND flash memory 300 according to this embodiment as depicted in FIG. 6.

In this embodiment, like the second embodiment, the number of total masks required at steps from the beginning to gate insulator formation is three that is less than that in the first embodiment by one, thus realizing simplification of processes and a reduction in a manufacturing cost.

As explained above, in the semiconductor storage device 300, e.g., the NAND flash memory according to this embodiment, the plurality of semiconductor element devices having different functions, e.g., the memory cell transistors CT and select transistors ST in the memory cell region 110 and the high voltage transistor HT and low voltage transistor LT in the peripheral circuit region 120, are disposed in appropriate regions of the partial SOI substrate, respectively. As a result, characteristics required for the respective semiconductor element devices can be achieved. Specifically, each cell transistor CT is disposed in the SOI section 112 to suppress a short channel effect. Each select transistor ST is disposed in a region including a non-SOI section (the opening area) 114 adjacent to the SOI section 112 to enable achieving conduction with a well in an erase operation. Moreover, the high voltage transistor HT and low voltage transistor LT as peripheral element devices are disposed on the bulk silicon substrate 10 having the excellent crystallinity. Even if the crystallinity of the SOI layer 16 is not good enough, these peripheral transistors can be avoided from problems, e.g., increase in junction leakage current, degradation of junction breakdown voltage, or degradation of gate insulator breakdown voltage, due to this not good crystallinity.

Additionally, in the semiconductor storage device 300 according to this embodiment, the surface of the gate insulator 22a in the memory cell region 110 and the surfaces of the high voltage gate insulator 20 and low voltage gate insulator 22b in the peripheral circuit region 120 are formed to have substantially the same level, thereby facilitating the process integration of the gate electrode forming process and subsequent manufacturing processes. To realize this structure, the interface between the semiconductor substrate 10 and the gate insulator 20 of the high voltage transistor HT is formed lower than that of the low voltage transistor LT.

Therefore, according to the embodiment, there is provided a semiconductor storage device in which the plurality of semiconductor element devices having different functions are included, the interface between each gate insulator and each gate electrode is formed to be the same level, and each semiconductor element device is disposed in the appropriate region of the partial SOI substrate, and a manufacturing method thereof.

Fourth Embodiment

Figure 8:
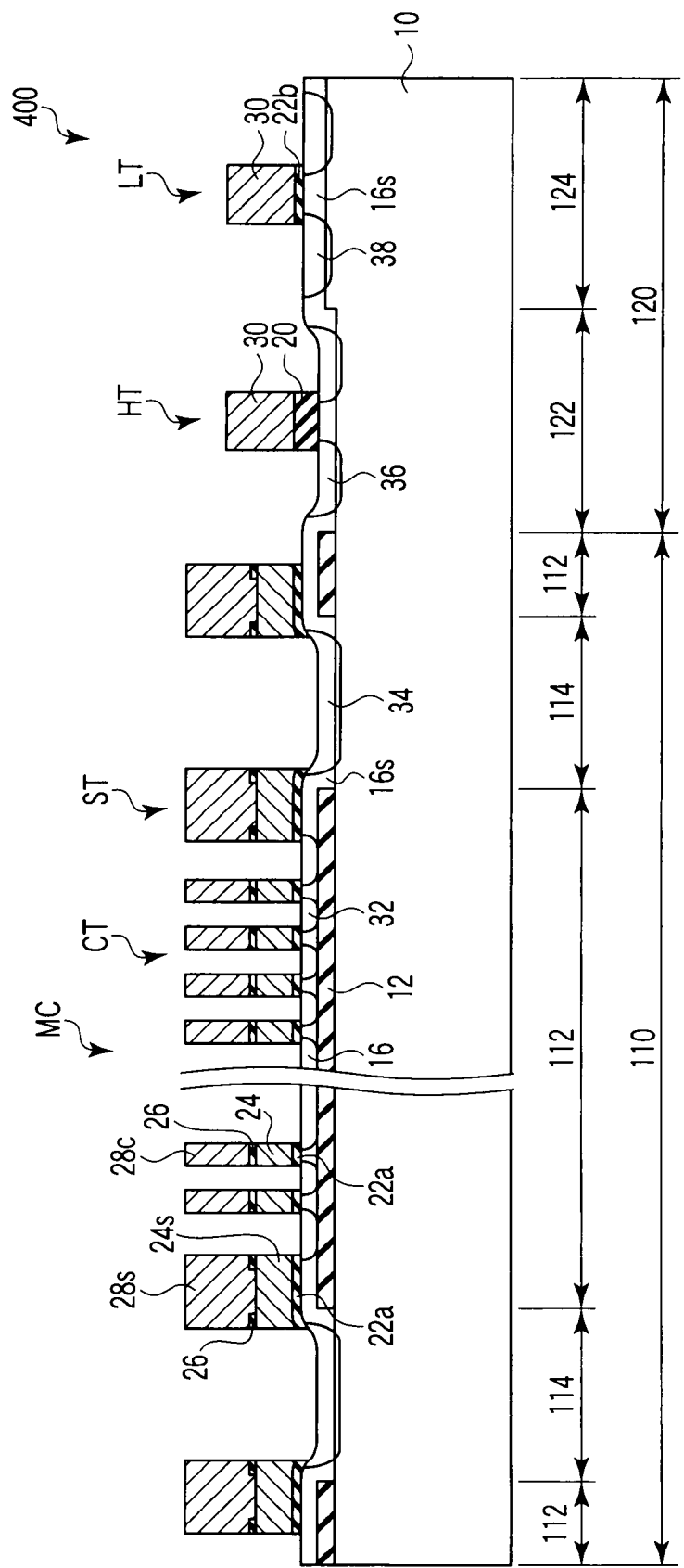
FIG. 8 is cross-sectional views for explaining an example of a cross-sectional structure of the semiconductor storage device according to a fourth embodiment of the present invention.

A semiconductor storage device and a manufacturing method thereof according to a fourth embodiment of the present invention are a semiconductor storage device that can be manufactured in processes from the beginning to gate insulator formation without using planarization by, e.g., CMP, and a manufacturing method thereof. FIG. 8 shows an example of a cross-sectional structure of a semiconductor storage device 400, e.g., a NAND flash memory according to this embodiment.

The NAND flash memory 400 according to this embodiment is provided on a partial SOI substrate including SOI sections 112 where memory cell arrays are formed. Each cell transistor CT in a memory cell region 110 is disposed on an SOI layer 16 in the SOI section 112, and each select transistor ST in the memory cell region 110 and each high voltage transistor HT and low voltage transistor LT in a peripheral circuit region 120 are disposed on a solid phase epitaxial layer 16s formed on a bulk silicon substrate. Therefore, these transistors are arranged to satisfy requirements for the respective transistors and obtain desired characteristics.

A structure of each transistor is the same as that in the first embodiment, thereby omitting an explanation thereof.

Since interfaces between gate insulators and gate electrodes of the respective transistors are formed to have substantially the same level as shown in FIG. 8, process integration of a gate electrode forming process and subsequent manufacturing processes can be facilitated. To realize this structure, an interface between the solid phase epitaxial layer 16s and a gate insulator 20 of the high voltage transistor HT is formed lower than that of the low voltage transistor LT. However, a level of one source/drain 34 of the select transistor ST disposed in each opening area 114 is slightly lower than that of the other source/drain 34. That is because planarization by, e.g., CMP, is not carried out in processes from the beginning to formation of the gate insulators 20 and 22. However, even when CMP is not performed, transistor characteristics are not adversely affected, and a manufacturing cost can be reduced as compared with the first to third embodiments.

A manufacturing method of the semiconductor storage device 400 according to this embodiment will now be explained with reference to process cross-sectional views of FIGS. 9A to 9E. These drawings are views including cross sections of the regions where the respective semiconductor element devices are formed like FIG. 8.

Figure 9A:
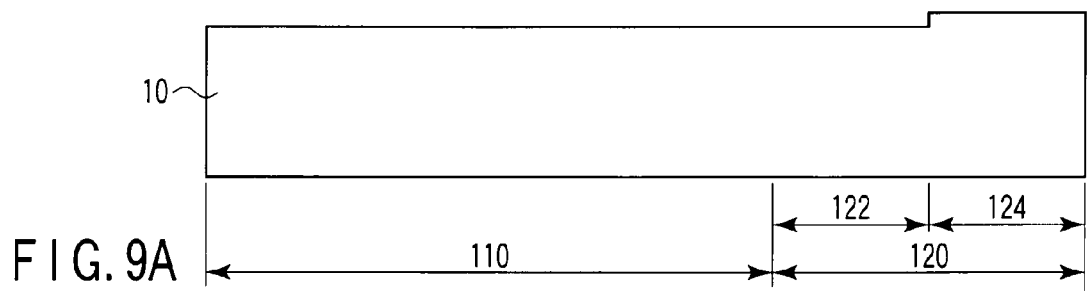
FIGS. 9A to 9E are process cross-sectional views for explaining an example of a manufacturing process of the semiconductor storage device according to the fourth embodiment.

(1) Referring to FIG. 9A, first, a semiconductor substrate 10, e.g., a silicon substrate, in not only the memory cell region 110 but also a high voltage transistor section 122 is recessed to form a first recess. In this step, although not shown, a first mask is used. The depth E5 of the first recess is as follows:

$$E5=t_{BOX},$$

where $t_{BOX}$ is a BOX film thickness.

Figure 9B:
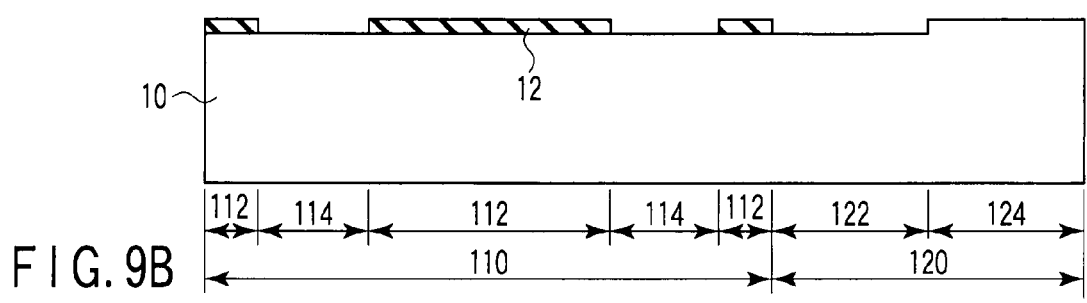

(2) Then, referring to FIG. 9B, an insulator, e.g., a silicon oxide film, that becomes a BOX film 12 is formed on the entire surface by, e.g., thermal oxidation. Further, the BOX film 12 in regions other than the SOI section 112 in the memory cell region 110 is removed. At this step, although not shown, a second mask is used. After removing the BOX film 12, the silicon substrate 10 in the high voltage transistor section 122 and a low voltage transistor section 124 in the peripheral circuit region 120 and each opening area 114 in the memory cell region 110 is exposed. Like the first to third embodiments, it is preferable to set an interval of the opening areas 114 to 4 to 5 μm in order to form single crystal silicon having the excellent crystallinity on the BOX film in solid phase epitaxial growth at the next step (3).

(3) Then, amorphous silicon is deposited on the entire surface by, e.g., CVD. A film thickness $t_{aSi}$ of the amorphous silicon deposited is as follows;

$$t_{aSi}>=(1-d)\times t_{Si},$$

where d is a volume shrinkage rate when crystallizing the amorphous silicon and $t_{Si}$ is the thickness of the SOI layer 16.

Figure 9C:
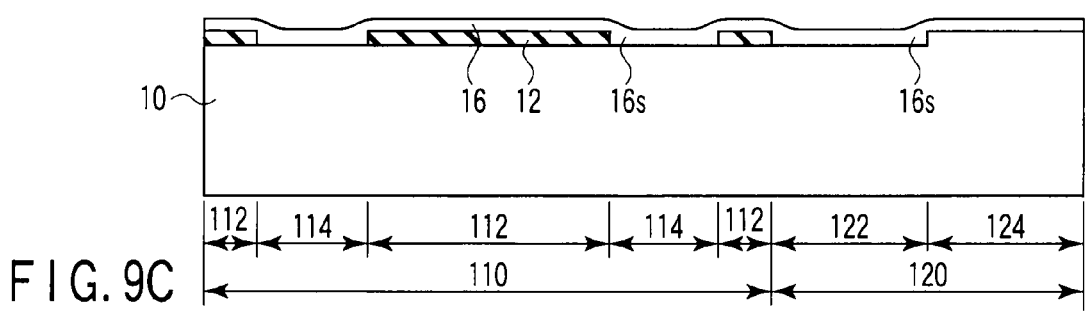

Further, crystallization annealing is performed and solid phase epitaxial growth is carried out while using the silicon substrate 10 in contacting with the amorphous silicon layer as a seed crystal, thereby transforming the amorphous silicon into single crystal silicon. As a result, the SOI layer 16 and the solid phase epitaxial layer 16s are formed (FIG. 9C). The SOI layer 16 and the solid phase epitaxial layer 16s can be etched back as required.

In this manner, the partial SOI substrate in which the memory cell region 110 has an SOI structure with the opening areas 114 and the peripheral circuit region 120 is the solid phase epitaxial layer 16s can be formed.

Figure 9D:
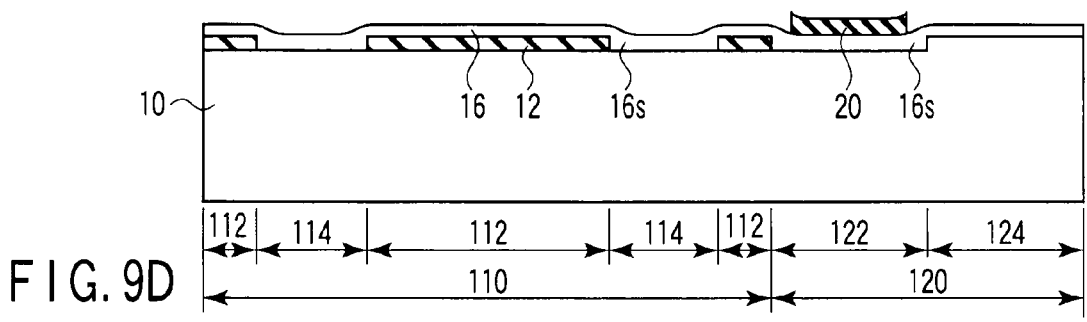

(4) Subsequently, a gate insulator 20, e.g., a silicon oxide film, of the high voltage transistor is formed on the entire surface by, e.g., thermal oxidation. It is preferable to form the gate insulator 20 to have the same thickness as a thickness of the BOX film 12 in order to make a gate insulator surface of each cell transistor and a gate insulator surface of the high voltage transistor to the same level. Then, as shown in FIG. 9D, the gate insulator 20 in regions excluding the high voltage transistor section 122 is removed to expose the SOI layer 16 or the epitaxial layer 16s in other regions. At this step, although not shown, a third mask is used.

Figure 9E:
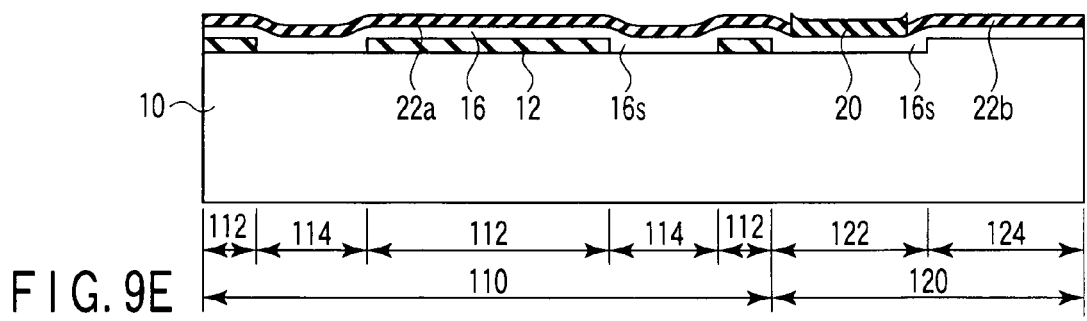

(5) Then, referring to FIG. 9E, gate insulators 22a and 22b, e.g., silicon oxide films, of the memory cell and the low voltage transistor are formed on the entire surface by, e.g., thermal oxidation.

In this manner, a surface of the gate insulator 22a in each SOI section 112 where the cell transistors CT are formed and surfaces of the high voltage gate insulator 20 and low voltage gate insulator 22b in the peripheral circuit region 120 are formed to be substantially the same level.

Thereafter, gate electrodes of the cell transistors CT, the select transistors ST, the high voltage transistor HT, and the low voltage transistor LT are formed, thereby completing the NAND flash memory 400 according to this embodiment shown in FIG. 8.

In this embodiment, the number of total masks required at the steps from the beginning to gate insulator formation is three that is less than that in the first embodiment by one, thus realizing simplification of the processes and a reduction in a manufacturing cost. Moreover, since planarization by, e.g., CMP is not used at the above-explained steps, which is advantageous to further reduction in the production cost.

As explained above, in the semiconductor storage device 400, e.g., the NAND flash memory, according to this embodiment, the plurality of semiconductor element devices having different functions, e.g., the memory cell transistors CT and select transistors ST in the memory cell region 110 and the high voltage transistor HT and low voltage transistor LT in the peripheral circuit region 120, are arranged in the appropriate regions of the partial SOI substrate, respectively. As a result, characteristics required for the respective semiconductor element devices are achieved. Specifically, each cell transistor CT is disposed in the SOI section 112 to suppress a short channel effect. Each select transistor ST is disposed in each non-SOI area (each opening area) 114 adjacent to the SOI section 112 to enable achieving conduction with a well in an erase operation. Moreover, the high voltage transistor HT and low voltage transistor LT in the peripheral circuit are disposed on the solid phase epitaxial layer 16s having the excellent crystallinity. Even if the crystallinity of the SOI layer 16 is not good enough, these peripheral transistors can be avoided from problems, e.g., increase in junction leakage current, degradation of junction breakdown voltage, or degradation of gate insulator breakdown voltage, due to this not good crystallinity.

Additionally, in the semiconductor storage device 400 according to this embodiment, since the surface of the gate insulator 22a in the memory cell region 110 and the surfaces of the high voltage gate insulator 20 and low voltage gate insulator 22b in the peripheral circuit region 120 are formed to be substantially the same level, thereby facilitating the process integration of the gate electrode forming process and subsequent manufacturing processes. To realize this structure, the interface between the solid phase epitaxial layer 16s and the gate insulator 20 of the high voltage transistor HT is made to be lower than that of the low voltage transistor LT. However, a level of one source/drain 34 of the select transistor ST is slightly lower than that of the other source/drain 34. That is because planarization by, e.g., CMP, is not performed in the processes from the beginning to formation of the gate insulators 20 and 22. Additionally, by not performing CMP, a manufacturing cost can be reduced as compared with the first to third embodiment without adversely affecting transistor characteristics.

Therefore, according to the embodiment, there is provided a semiconductor storage device in which the plurality of semiconductor element devices having different functions are included, the interface between each gate insulator and each gate electrode is formed to be the same level, and each semiconductor element device is disposed in the appropriate region of the partial SOI substrate, and a manufacturing method thereof.

The non-volatile semiconductor storage device, e.g., the NAND flash memory, includes the plurality of semiconductor element devices having different functions, e.g., the memory cell transistors and select transistors in the memory cell region and the high voltage transistor and low voltage transistor in the peripheral circuit region. Since these semiconductor element devices have different required characteristics and device structures, they are arranged in the appropriate regions of the partial SOI substrate. Specifically, each cell transistor is disposed in the SOI section to enable suppressing the short channel effect. Each select transistor is disposed in each non-SOI section (each opening area) adjacent to the SOI section to enable achieving conduction with a well in an erase operation. And, the high voltage transistor and low voltage transistor in the peripheral circuit are disposed on the bulk silicon substrate having the excellent crystallinity. Even if the crystallinity of the SOI layer is not good enough, these peripheral transistors can be avoided from problems, e.g., increase in junction leakage current, degradation of junction breakdown voltage, or degradation of gate insulator breakdown voltage, due to this not good crystallinity.

Moreover, although the gate insulators of these plurality of semiconductor element devices do not all have the same thickness, the interface between each gate insulator and each gate electrode is formed to be the same level, thereby facilitating process integration. To realize this structure, the interface between the semiconductor substrate and the gate insulator of the high voltage transistor is formed lower than that of the low voltage transistor LT.

The present invention is not limited to the foregoing embodiments and may be modified and implemented in many ways without departing from the spirit and the scope of the present invention.

For example, the semiconductor substrate is not limited to the silicon substrate, and a compound semiconductor substrate and others may be used. The SOI layer does not need to be formed of the same material as the semiconductor substrate, and a compound semiconductor, silicon germanium, and others may be used besides silicon. Additionally, the buried insulator is not limited to the silicon oxide (BOX) film, and an insulator, e.g., a silicon nitride film, may also be used.

Further, the present invention is not limited to the NAND flash memory, and may be applied to a semiconductor storage device, e.g., a NOR flash memory.

As described above, according to the embodiments of the present invention, there are provided semiconductor storage devices in which the plurality of semiconductor element devices having different functions are included, the interface between each gate insulator and each gate electrode is formed to be the same level, and each semiconductor element device is disposed in the appropriate region of the partial SOI substrate, and manufacturing methods thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
   a first semiconductor region provided in a semiconductor substrate including a buried insulator having opening portions;
   a second semiconductor region provided in the semiconductor substrate without including the buried insulator, the second semiconductor region being different from the first semiconductor region;
   a plurality of first semiconductor element devices disposed above the buried insulator in the first semiconductor region;
   a plurality of second semiconductor element devices each disposed in a region including a region above the opening portion of the buried insulator in the first semiconductor region; and
   a plurality of third semiconductor element devices disposed in the second semiconductor region,
   wherein levels of interfaces between first gate insulators and first gate electrodes provided on the gate insulators of the first semiconductor element devices, between second gate insulators and second gate electrodes of the second semiconductor element devices, and between third gate insulators and third gate electrodes of the third semiconductor element devices are equivalent to each other.

2. The device according to claim 1, wherein the plurality of first semiconductor element devices are memory cell transistors, and the plurality of second semiconductor element devices are select transistors that select one or more memory cell transistors.

3. The device according to claim 2, wherein the plurality of first semiconductor element devices are electrically connected in series to constitute a chain, and the plurality of second semiconductor element devices are disposed at both ends of the chain.

4. A semiconductor storage device comprising:
   a first semiconductor region provided in a semiconductor substrate including a buried insulator having opening portions;
   a second semiconductor region provided in the semiconductor substrate without including the buried insulator, the second semiconductor region being different from the first semiconductor region;
   a plurality of first semiconductor element devices disposed above the buried insulator in the first semiconductor region;
   a plurality of second semiconductor element devices each disposed in a region including a region above the opening portion of the buried insulator in the first semiconductor region; and
   a plurality of third semiconductor element devices disposed in the second semiconductor region,
   wherein the plurality of third semiconductor element devices include a high voltage transistor and a low voltage transistor, levels of interfaces between a first third gate insulator and a first third gate electrode provided on the first third gate insulator of the high voltage transistor and between a second third gate insulator and a second third gate electrode provided on the second third gate insulator of the low voltage transistor are equivalent to each other, and a level of an interface between the semiconductor substrate and the first third gate insulator of the high voltage transistor is lower than a level of an interface between the semiconductor substrate and the second third gate insulator of the low voltage transistor.

5. The device according to claim 4, wherein the first semiconductor element devices, the second semiconductor element devices, and the low voltage transistor are disposed on an epitaxial layer.

6. The device according to claim 4, wherein the high voltage transistor is disposed on a first recess formed in the semiconductor substrate in the second semiconductor region.

7. The device according to claim 1, wherein a diffusion layer of one of the first semiconductor element devices, the second semiconductor element devices, and the third semiconductor element devices is disposed above the opening portion of the buried insulator.

8. The device according to claim 1, wherein an interval of the opening portions is 4 to 5 µm.

9. A semiconductor storage device comprising:
- a first semiconductor region provided in a semiconductor substrate including a buried insulator having opening portions;
- a second semiconductor region provided in the semiconductor substrate without including the buried insulator, the second semiconductor region being different from the first semiconductor region;
- a plurality of first semiconductor element devices disposed above the buried insulator in the first semiconductor region;
- a plurality of second semiconductor element devices each disposed in a region including a region above the opening portion of the buried insulator in the first semiconductor region; and
- a plurality of third semiconductor element devices disposed in the second semiconductor region,
- wherein the first semiconductor region includes a recess formed in the semiconductor substrate.

10. The device according to claim 4, wherein a diffusion layer of one of the first semiconductor element devices, the second semiconductor element devices, and the third semiconductor element devices is disposed above the opening portion of the buried insulator.

11. The device according to claim 4, wherein an interval of the opening portions is 4 to 5 µm.

12. The device according to claim 9, wherein a diffusion layer of one of the first semiconductor element devices, the second semiconductor element devices, and the third semiconductor element devices is disposed above the opening portion of the buried insulator.

13. The device according to claim 9, wherein an interval of the opening portions is 4 to 5 µm.

* * * * *